(12) United States Patent
Hirase et al.

(10) Patent No.: US 11,094,734 B2
(45) Date of Patent: Aug. 17, 2021

(54) IMAGING DEVICE

(71) Applicant: PANASONIC INTELLECTUAL PROPERTY MANAGEMENT CO., LTD., Osaka (JP)

(72) Inventors: Junji Hirase, Osaka (JP); Yoshinori Takami, Toyama (JP); Shota Yamada, Shiga (JP); Yoshihiro Sato, Osaka (JP); Yoshiaki Satou, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/909,070

(22) Filed: Jun. 23, 2020

(65) Prior Publication Data

US 2020/0321385 A1 Oct. 8, 2020

Related U.S. Application Data

(63) Continuation of application No. 16/038,896, filed on Jul. 18, 2018, now Pat. No. 10,734,432.

(30) Foreign Application Priority Data

Jul. 31, 2017 (JP) .............................. JP2017-147976
Mar. 1, 2018 (JP) .............................. JP2018-036110

(51) Int. Cl.
*H01L 27/146* (2006.01)
*H01L 27/148* (2006.01)
(Continued)

(52) U.S. Cl.
CPC .... *H01L 27/14643* (2013.01); *H01L 27/1462* (2013.01); *H01L 27/14603* (2013.01);
(Continued)

(58) Field of Classification Search
CPC ......... H01L 27/14603; H01L 27/14643; H01L 27/14665; H01L 27/14609;
(Continued)

(56) References Cited

U.S. PATENT DOCUMENTS

2009/0243025 A1* 10/2009 Stevens ............. H01L 27/14603
257/461
2010/0103299 A1 4/2010 Miyata
(Continued)

FOREIGN PATENT DOCUMENTS

JP 2-278874 A 11/1990
JP 2011-049579 A 3/2011
(Continued)

OTHER PUBLICATIONS

The Extended European Search Report dated Jan. 30, 2019 for the related European Patent Application No. 18185440.7.
(Continued)

*Primary Examiner* — Jonathan Han
(74) *Attorney, Agent, or Firm* — McDermott Will and Emery LLP

(57) ABSTRACT

An imaging device including a semiconductor substrate having a first surface, the semiconductor substrate including: a first layer containing an impurity of a first conductivity type; a second layer containing an impurity of a second conductivity type different from the first conductivity type, the second layer being closer to the first surface than the first layer is; and a pixel. The pixel includes a photoelectric converter configured to convert light into charge; and a first diffusion region containing an impurity of the first conductivity type, the first diffusion region facing the first layer via the second layer, configured to store at least a part of the charge. The first layer having a second surface adjacent to the second layer, the second surface including a convex
(Continued)

portion toward the first surface, and the convex portion facing the first diffusion region.

18 Claims, 13 Drawing Sheets

(51) Int. Cl.
  *H04N 5/357* (2011.01)
  *H04N 5/3745* (2011.01)
  *H04N 5/363* (2011.01)
  *H04N 5/378* (2011.01)

(52) U.S. Cl.
  CPC .. *H01L 27/14609* (2013.01); *H01L 27/14612* (2013.01); *H01L 27/14806* (2013.01); *H01L 27/1461* (2013.01); *H04N 5/3575* (2013.01); *H04N 5/363* (2013.01); *H04N 5/378* (2013.01); *H04N 5/3745* (2013.01)

(58) Field of Classification Search
  CPC ........... H01L 27/14612; H01L 27/1462; H01L 27/14806; H01L 27/1461; H04N 5/3575; H04N 5/363; H04N 5/3745; H04N 5/378
  USPC ................ 348/294; 257/E31.127, 222, 291; 438/69
  See application file for complete search history.

(56) References Cited

U.S. PATENT DOCUMENTS

| | | | |
|---|---|---|---|
| 2012/0083067 A1* | 4/2012 | Doan | H01L 27/1463 438/87 |
| 2012/0211854 A1* | 8/2012 | Anderson | H01L 27/14614 257/458 |
| 2014/0043510 A1 | 2/2014 | Kasuga et al. | |
| 2014/0103400 A1 | 4/2014 | Sakata et al. | |
| 2015/0109503 A1 | 4/2015 | Mori et al. | |
| 2016/0079297 A1 | 3/2016 | Sato et al. | |
| 2017/0092669 A1* | 3/2017 | Jerome | H01L 27/14683 |

FOREIGN PATENT DOCUMENTS

| | | |
|---|---|---|
| JP | 2016-063216 A | 4/2016 |
| WO | 2012/147302 A1 | 11/2012 |
| WO | 2014/002330 A1 | 1/2014 |

OTHER PUBLICATIONS

Non-Final Office Action issued in U.S. Appl. No. 16/038,896, dated Aug. 20, 2019.
Notice of Allowance issued in U.S. Appl. No. 16/038,896, dated Mar. 25, 2020.

* cited by examiner

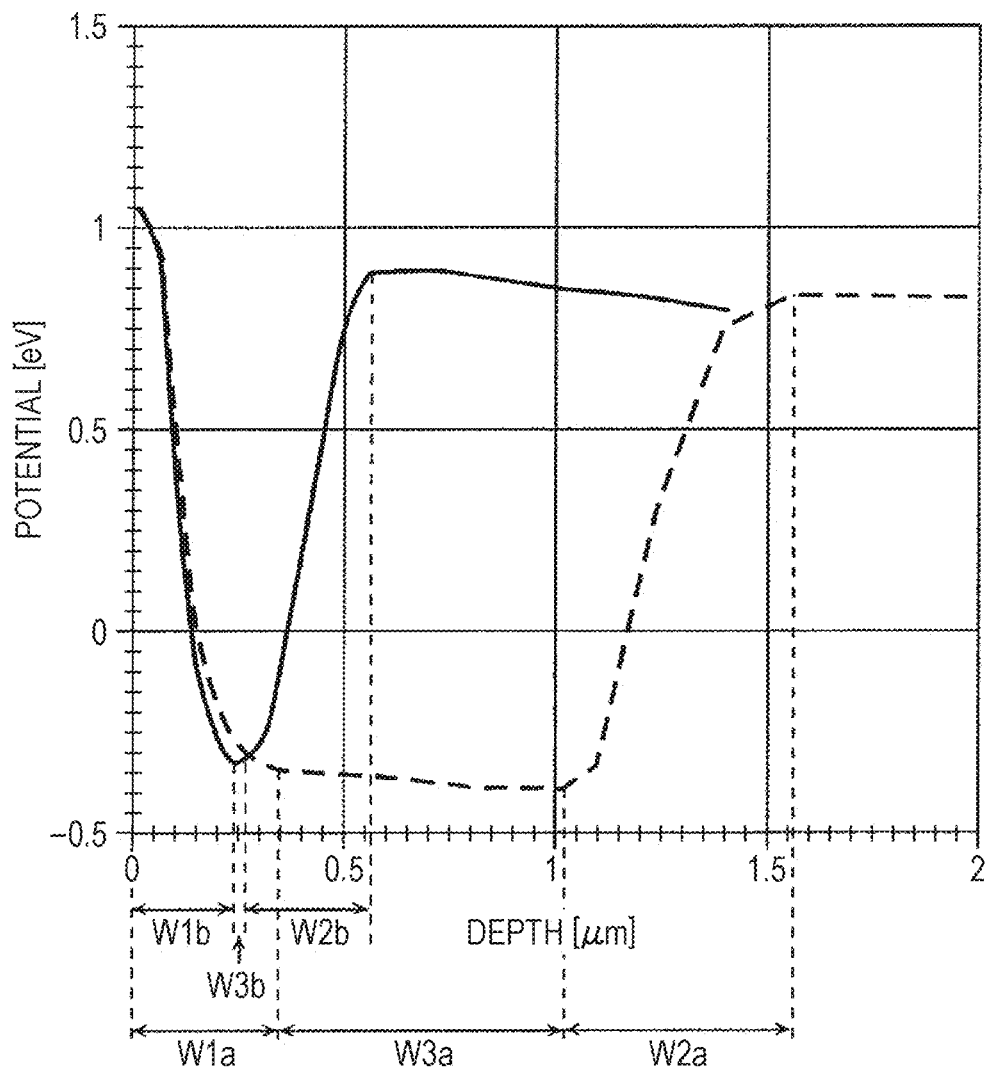

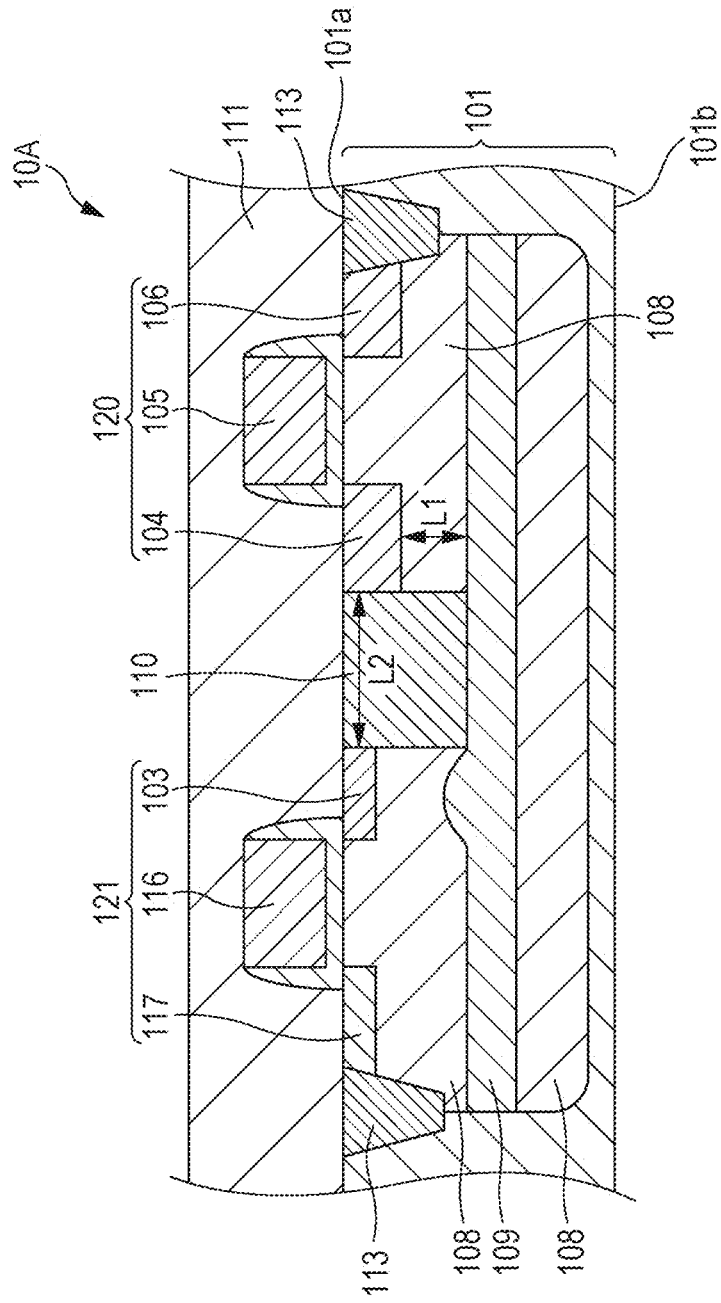

IMAGING DEVICE

CROSS-REFERENCE OF RELATED APPLICATIONS

This application a Continuation of U.S. patent application Ser. No. 16/038,896, filed on Jul. 18, 2018, which claims the benefit of Japanese Application No. 2017-147976, filed on Jul. 31, 2017 and Japanese Application No. 2018-036110, fled on Mar. 1, 2018, the entire disclosures of which applications are incorporated by reference herein.

BACKGROUND

1. Technical Field

The present disclosure relates to an imaging device.

2. Description of the Related Art

Charge coupled device (CCD) image sensors and complementary metal oxide semiconductor (CMOS) image sensors are widely used in digital cameras and the like. As is well known, such image sensors each include a photodiode formed at a semiconductor substrate.

A structure in which a photoelectric converter having a photoelectric conversion layer is arranged on an upper side of a semiconductor substrate has been proposed (International Publications Nos. 2014/002330 and 2012/147302, for example). An imaging device having such a structure may be called a stacked imaging device. In a stacked imaging device, charges generated through photoelectric conversion are stored in a charge storage region (called a floating diffusion (FD)). A signal corresponding to the amount of charges stored in the charge storage region is read out via a readout circuit formed at a semiconductor substrate.

SUMMARY

In a stacked imaging device, a leakage current from or to a charge storage region (hereinafter also called a "dark current") may cause a deterioration in an obtained image. It is beneficial to reduce such a leakage current.

One non-limiting and exemplary embodiment provides an imaging device described below.

In one general aspect, the techniques disclosed here feature an imaging device including a semiconductor substrate having a first surface, the semiconductor substrate including: a first layer containing an impurity of a first conductivity type; a second layer containing an impurity of a second conductivity type different from the first conductivity type, the second layer being closer to the first surface than the first layer is; and a pixel. The pixel includes a photoelectric converter configured to convert light into charge; and a first diffusion region containing an impurity of the first conductivity type, the first diffusion region facing the first layer via the second layer, configured to store at least a part of the charge. The first layer having a second surface adjacent to the second layer, the second surface including a convex portion toward the first surface, and the convex portion facing the first diffusion region.

It should be noted that general or specific embodiments may be implemented as an element, a device, a module, a system, an integrated circuit, a method, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 5 is a graph showing a potential distribution in a depth direction of the semiconductor substrate along a line segment passing through a center of the first diffusion region shown in each of FIGS. 4A and 4B;

FIG. 12 is a schematic cross-sectional view of the pixel in the PD imaging device taken along a cross-section different from those in FIGS. 10 and 11.

Figure 1:
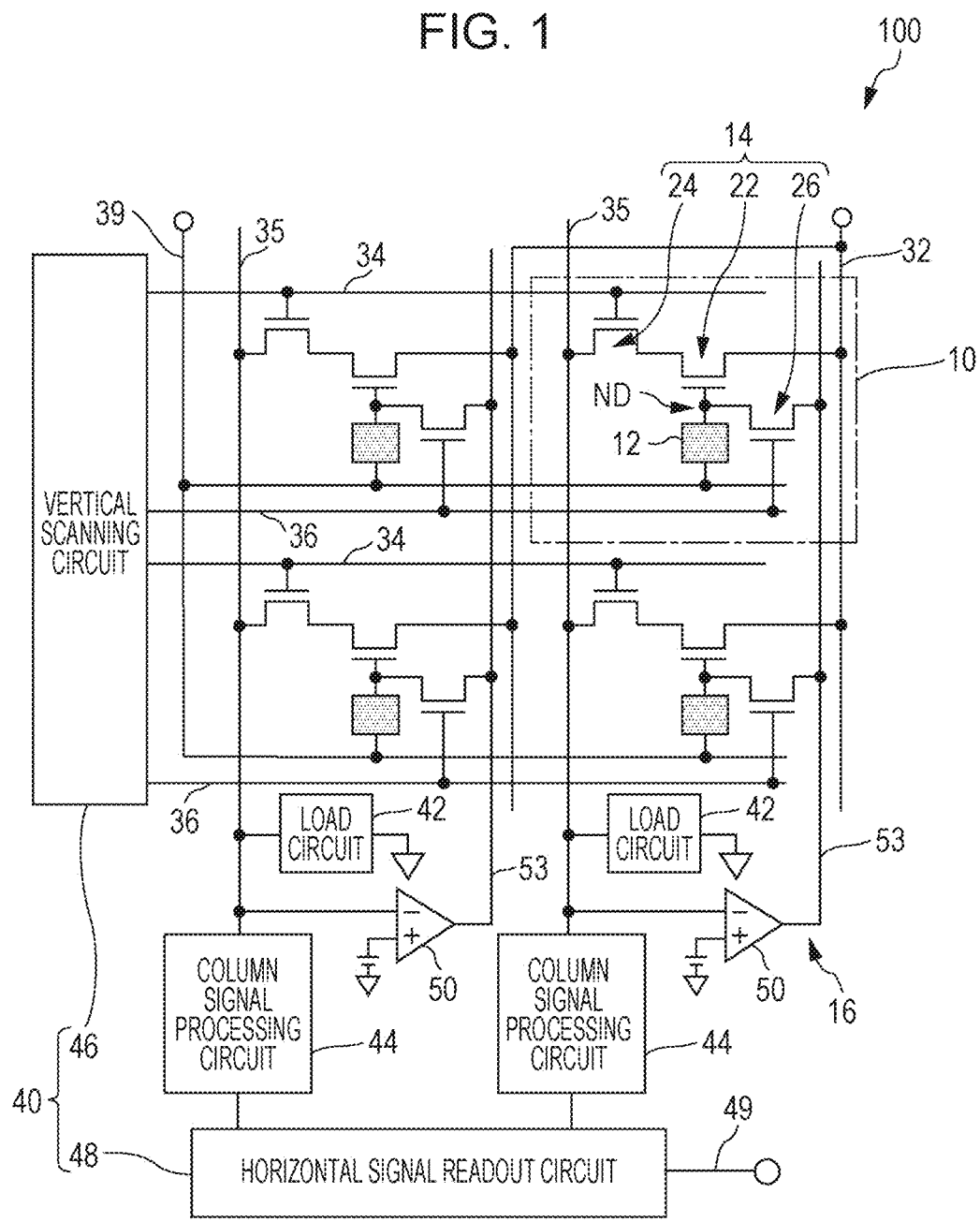
FIG. 1 is a diagram showing a circuit configuration of an imaging device according to an embodiment.

DETAILED DESCRIPTION (Underlying Knowledge Forming Basis of the Present Disclosure)

Various examinations have been conducted focusing on prevention of a leakage current from near a charge storage region or a leakage current from a junction between the charge storage region and a semiconductor substrate in a stacked imaging device. That is, examinations have been conducted to reduce electric field strength at a junction.

Examinations have also been conducted to prevent minority carriers generated in a peripheral circuit of a pixel from flowing into the pixel. For example, covering a lower side of a p-type semiconductor substrate with an n-type semiconductor layer, taking minority carriers in the p-type semiconductor substrate into the n-type semiconductor layer, and discharging the minority carriers to the outside are under examination.

However, few examinations have been conducted so far to prevent minority carriers inside a pixel from flowing into a charge storage region. The present disclosure focuses on prevention of inflow of minority carriers generated in a semiconductor substrate, especially inside a unit pixel, into a charge storage region. More specifically, the present disclosure is intended to reduce inflow of minority carriers generated in a source or a drain of a plurality of transistors arranged inside the unit pixel into the charge storage region. This reduces a leakage current in the charge storage region and variation in leakage current.

An overview of an aspect of the present disclosure is as follows.

An imaging device according to the aspect of the present disclosure includes a semiconductor substrate having a first surface, the semiconductor substrate including: a first layer containing an impurity of a first conductivity type; a second layer containing an impurity of a second conductivity type different from the first conductivity type, the second layer being closer to the first surface; and a pixel including: a photoelectric converter configured to convert light into charge; a first diffusion region containing an impurity of the first conductivity type, the first diffusion region facing the first layer via the second layer, configured to store at least a part of the charge; and a second diffusion region being a diffusion region closest to the first diffusion region among diffusion regions containing an impurity of the first conductivity type, the diffusion regions facing the first layer via the second layer. A distance between the second diffusion region and the first layer is equal to or less than 1.5 times a distance between the second diffusion region and the first diffusion region.

The above-described configuration makes minority carriers which are generated at, for example, a junction between the second diffusion region containing the impurity of the first conductivity type and the second region containing the impurity of the second conductivity type more likely to be absorbed in the first region. For this reason, inflow of minority carriers into the first diffusion region that is a charge storage region can be reduced. That is, a leakage current to the first diffusion region can be reduced. It is thus possible to reduce a dark current in the first diffusion region and variation in dark current.

For example, in the imaging device according to the aspect of the present disclosure, the pixel may include a first transistor, the second diffusion region functioning as a source or a drain of the first transistor.

For example, in the imaging device according to the aspect of the present disclosure, the distance between the second diffusion region and the first layer may not be more than the distance between the second diffusion region and the first diffusion region.

For example, in the imaging device according to the aspect of the present disclosure, the first diffusion region may function as a source or a drain of the first transistor.

For example, in the imaging device according to the aspect of the present disclosure, the pixel may include a second transistor different from the first transistor, the first diffusion region functioning as a source or a drain of the second transistor.

With the above-described configuration, minority carriers generated in a source or a drain nearest to the first diffusion region among sources and drains of different transistors which do not include the first diffusion region are also absorbed in the first region. For this reason, inflow of minority carriers into the first diffusion region that is a charge storage region can be reduced. That is, a leakage current to the first diffusion region as a charge storage region can be reduced. It is thus possible to reduce a dark current in the first diffusion region and variation in dark current.

For example, in the imaging device according to the aspect of the present disclosure, the first layer may include a first portion adjacent to the second layer and a second portion adjacent to the second layer, the first portion facing the first diffusion region, the second portion not facing the first diffusion region, and a distance between the first portion and the first surface may be smaller than a distance between the second portion and the first surface.

As described above, the distance between the first portion that faces the first diffusion region and a first surface of the semiconductor substrate is smaller than the distance between the second portion that does not face the first diffusion region and the first surface of the semiconductor substrate. Minority carriers in the semiconductor substrate are more likely to be absorbed in the first portion. This allows reduction of inflow of minority carriers into the first diffusion region.

For example, in the imaging device according to the aspect of the present disclosure, the second layer may have a second surface adjacent to the second layer, the second surface having a convex portion toward the first surface, the convex portion facing the first diffusion region.

For example, in the imaging device according to the aspect of the present disclosure, a potential curve in a depth direction from the first surface of the semiconductor substrate along a line passing through a center of the first diffusion region may have a first range where a potential decreases monotonously as a depth increases, a second range where the potential increases monotonously as a depth increases, and a third range between the first range and the second range where an absolute value of a slope of the potential curve is smaller than an absolute value of a slope of the potential curve in each of the first range and the second range, and a width of the third range may be smaller than a sum of a width of the first range and a width of the second range.

The width of the third range smaller than the sum of the width of the first range and the width of the second range means a smaller distance between the first diffusion region and the first region. Thus, minority carriers in the semiconductor substrate are more likely to be absorbed in the first region. This allows reduction of inflow of minority carriers into the first diffusion region.

For example, in the imaging device according to the aspect of the present disclosure, the photoelectric converter may be located above the first surface of the semiconductor substrate.

An imaging device according to an aspect of the present disclosure may include a semiconductor substrate having a first surface, the semiconductor substrate including: a first layer containing an impurity of a first conductivity type; a second layer containing an impurity of a second conductivity type different from the first conductivity type, the second layer being closer to the first surface; and a pixel including:

a photoelectric converter configured to convert light into charge; a first diffusion region containing an impurity of the first conductivity type, the first diffusion region facing the first layer via the second layer, configured to store at least a part of the charge; and a second diffusion region being a diffusion region closest to the first diffusion region among diffusion regions containing an impurity of the first conductivity type, the diffusion regions facing the first layer via the second layer. A potential curve in a depth direction from the first surface of the semiconductor substrate along a line passing through a center of the first diffusion region has a first range where a potential decreases monotonously as a depth increases, a second range where the potential increases monotonously as a depth increases, and a third range between the first range and the second range where an absolute value of a slope of the potential curve is smaller than an absolute value of a slope of the potential curve in each of the first range and the second range. A width of the third range is smaller than a sum of a width of the first range and a width of the second range.

The width of the third range smaller than the sum of the width of the first range and the width of the second range means a smaller distance between the first diffusion region and the first region. Thus, minority carriers in the semiconductor substrate are more likely to be absorbed in the first region. This allows reduction of inflow of minority carriers into the first diffusion region.

For example, in the imaging device according to the aspect of the present disclosure, the second layer may have a second surface adjacent to the second layer, the second surface having a convex portion toward the first surface, the convex portion facing the first diffusion region.

For example, in the imaging device according to the aspect of the present disclosure, the photoelectric converter may be located above the first surface of the semiconductor substrate.

The above-described configuration eliminates the need to provide the photoelectric converter in the semiconductor substrate and allows a plurality of transistors to be provided in the semiconductor substrate such that the transistors overlap with the photoelectric converter in plan view. For this reason, an area of the pixel in plan view can be made smaller.

An embodiment will be specifically described below with reference to the drawings.

Note that the embodiment described below is a comprehensive or specific illustration. Numerical values, shapes, materials, constituent elements, the arrangement positions and connection forms of the constituent elements, steps, the order of the steps, and the like illustrated in the embodiment below are merely illustrative, and are not intended to limit the present disclosure. Among the constituent elements in the embodiment below, those not described in an independent claim representing a top-level concept will be described as optional constituent elements. The drawings are not exactly to scale. In the drawings, substantially the same constituent elements are denoted by the same reference characters, and a redundant description thereof may be omitted or simplified.

It should be noted that general or specific embodiments may be implemented as an element, a device, a module, a system, a method, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

Embodiment

FIG. 1 is a diagram showing a circuit configuration of an imaging device 100 according to an embodiment. In FIG. 1, four pixels 10 arrayed in two rows and two columns of the plurality of pixels 10 are shown to avoid complexity.

The imaging device 100 according to the present embodiment includes the plurality of pixels 10 and peripheral circuits 40. The peripheral circuits 40 include a vertical scanning circuit 46 (also called a "row scanning circuit") and a horizontal signal readout circuit 48 (also called a "column scanning circuit"). The vertical scanning circuit 46 has connections to address signal lines 34 which are provided so as to correspond to rows of the plurality of pixels 10. The horizontal signal readout circuit 48 has connections to vertical signal lines 35 which are provided so as to correspond to columns of the plurality of pixels 10. The peripheral circuits 40 may further include a signal processing circuit, an output circuit, a control circuit, a power supply which supplies a predetermined voltage to each pixel 10, and the like.

Each pixel 10 includes a photoelectric converter 12 and a signal detection circuit 14 which is electrically connected to the photoelectric converter 12. The photoelectric converter 12 of each pixel 10 receives incident light and generates positive and negative charges (typically a hole-electron pair). The photoelectric converter 12 of each pixel 10 has a connection to a storage control line 39, and a predetermined voltage is applied to the storage control line 39 when the imaging device 100 is in operation. With the application of the predetermined voltage to the storage control line 39, one of positive and negative charges generated through photoelectric conversion can be selectively stored in a charge storage region. A case where a positive one of positive and negative charges generated through photoelectric conversion is used as a signal charge will be illustrated below as an example.

In the configuration illustrated in FIG. 1, the signal detection circuit 14 includes an amplification transistor 22 (also called a "readout transistor") and a reset transistor 26. In the present example, the signal detection circuit 14 further includes an address transistor 24 (also called a "row selection transistor"). As will be described later in detail with reference to the drawings, the amplification transistor 22, the reset transistor 26, and the address transistor 24 of the signal detection circuit 14 are typically field effect transistors (FETs) which are formed on a semiconductor substrate 60 supporting the photoelectric converter 12. An example using an N-channel metal oxide semiconductor (MOS) as a transistor will be described below unless otherwise noted. Note that which one of two diffusion layers of an FET corresponds to a source and which one corresponds to a drain depend on the polarity of the FET and the level of a potential at a time point in question. For this reason, which one serves as the source and which one serves as the drain may vary in accordance with an operating condition of the FET.

As schematically shown in FIG. 1, a gate of the amplification transistor 22 is electrically connected to the photoelectric converter 12. Charges generated by the photoelectric converter 12 are stored in a charge storage node (also called a "floating diffusion node") ND between the photoelectric converter 12 and the amplification transistor 22. Note that the charge storage node ND refers to wiring and the charge storage region, the wiring electrically connecting the charge storage region, the gate of the amplification transistor 22, and a lower electrode of the photoelectric converter 12.

A drain of the amplification transistor 22 is connected to apiece of power-supply wiring 32 (also called a source follower power supply) which supplies a predetermined power-supply voltage VDD (about 3.3 V, for example) to each pixel 10 when the imaging device 100 is in operation. The amplification transistor 22 outputs a signal voltage corresponding to the amount of signal charges generated by the photoelectric converter 12. A source of the amplification transistor 22 is connected to a drain of the address transistor 24.

The vertical signal line 35 is connected to a source of the address transistor 24. As shown in FIG. 1, the vertical signal line 35 is provided for each column of the plurality of pixels 10, and a load circuit 42 and a column signal processing circuit 44 (also called a "row signal storage circuit") are connected to each vertical signal line 35. The load circuit 42 together with the amplification transistor 22 forms a source follower circuit.

The address signal line 34 is connected to a gate of the address transistor 24. The address signal line 34 is provided for each row of the plurality of pixels 10. The address signal line 34 is connected to the vertical scanning circuit 46, and the vertical scanning circuit 46 applies a row selection signal for controlling turn-on and turn-off of the address transistor 24 to the address signal line 34. Scanning in a vertical direction (column direction) is performed for a row to be read out, and the row to be read out is selected. The vertical scanning circuit 46 can read out outputs from the amplification transistors 22 of the selected pixels 10 onto the corresponding vertical signal lines 35 by controlling turn-on and turn-off of the address transistors 24 via the address signal line 34. The arrangement of the address transistor 24 is not limited to that in the example shown in FIG. 1, and the address transistor 24 may be arranged between the drain of the amplification transistor 22 and the piece of power-supply wiring 32.

A signal voltage from the pixel 10 which is output onto the vertical signal line 35 via the address transistor 24 is input to a corresponding one of the plurality of column signal processing circuits 44. The column signal processing circuit 44 is provided for each column of the plurality of pixels 10 so as to correspond to the vertical signal line 35. The column signal processing circuit 44 and the load circuit 42 may be a part of the peripheral circuits 40 described above.

The column signal processing circuit 44 performs noise suppression signal processing typified by correlated double sampling, analog-digital conversion (AD conversion), and the like. The column signal processing circuit 44 is connected to the horizontal signal readout circuit 48. The horizontal signal readout circuit 48 sequentially reads out signals from the plurality of column signal processing circuit 44 onto a horizontal common signal line 49.

In the configuration illustrated in FIG. 1, the signal detection circuit 14 includes the reset transistor 26, a drain of which is connected to the charge storage node ND. A reset signal line 36 which has a connection to the vertical scanning circuit 46 is connected to a gate of the reset transistor 26. The reset signal line 36 is provided for each row of the plurality of pixels 10, like the address signal line 34. The vertical scanning circuit 46 can select the pixels 10 as objects to be reset on a row-by-row basis by applying a row selection signal to the address signal line 34. Additionally, the vertical scanning circuit 46 applies a reset signal for controlling turn-on and turn-off of the reset transistor 26 to the gates of the reset transistors 26 via the reset signal line 36. Thus, the reset transistors 26 in a selected row can be turned on. Turn-on of the reset transistor 26 resets a potential of the charge storage node ND.

In the present example, a source of the reset transistor 26 is connected to one of feedback lines 53. The feedback line 53 is provided for each column of the plurality of pixels 10. That is, in the example, a voltage of the feedback line 53 is supplied to the charge storage node ND as a reset voltage for initializing charges in the photoelectric converter 12. The feedback line 53 is connected to an output terminal of a corresponding one of inverting amplifiers 50. The inverting amplifier 50 is provided for each column of the plurality of pixels 10. The inverting amplifier 50 may be a part of the peripheral circuits 40 described above.

Focus on one of the columns of the plurality of pixels 10. As shown in FIG. 1, an inverting input terminal of the inverting amplifier 50 is connected to the vertical signal line 35 in the column. The output terminal of the inverting amplifier 50 and one or more pixels 10 in the column are connected via the feedback line 53. When the imaging device 100 is in operation, a predetermined voltage (a positive voltage of 1 V or a positive voltage close to 1 V, for example) Vref is supplied to a noninverting input terminal of the inverting amplifier 50. One of one or more pixels 10 in the column is selected, and the address transistor 24 and the reset transistor 26 are turned on, which allows formation of a feedback path for negatively feeding back an output from the pixel 10. With the formation of the feedback path, a voltage of the vertical signal line 35 converges on the voltage Vref input to the noninverting input terminal of the inverting amplifier 50. In other words, the formation of the feedback path resets a voltage of the charge storage node ND to a voltage which sets the voltage of the vertical signal line 35 to the voltage Vref. A voltage of arbitrary magnitude within a range between the power-supply voltage (3.3 V, for example) and a ground voltage (0 V) can be used as the voltage Vref. The inverting amplifier 50 may be called a feedback amplifier. As described above, the imaging device 100 includes a feedback circuit 16 which includes the inverting amplifier 50 as a part of the feedback path.

As is well known, thermal noise called kTC noise is generated upon turn-on or turn-off of a transistor. Noise which is generated upon turn-on or turn-off of a reset transistor is called reset noise. Reset noise which is generated by turning off a reset transistor after resetting of a potential of a charge storage region may remain in the charge storage region before signal charge storage. The reset noise that is generated upon turn-off of the reset transistor can be reduced using feedback. Details of suppression of reset noise using feedback are described in International Publication No. 2012/147302. The disclosure of International Publication No. 2012/147302 is incorporated by reference herein in its entirety.

In the configuration illustrated in FIG. 1, formation of a feedback path causes an AC component of thermal noise to be fed back to the source of the reset transistor 26. Since a feedback path is formed until immediately before the reset transistor 26 is turned off in the configuration illustrated in FIG. 1, reset noise which is generated upon the turn-off of the reset transistor 26 can be reduced.

Figure 2:
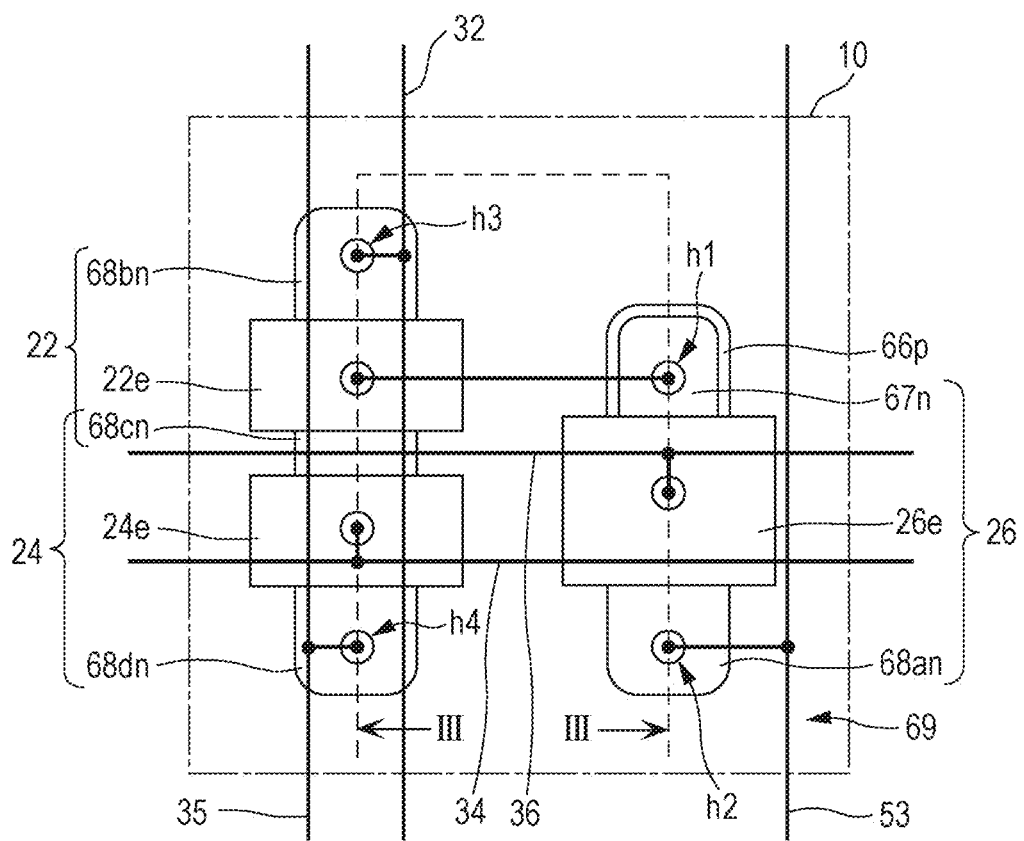
FIG. 2 is a plan view showing a layout inside a pixel according to the embodiment.
Figure 3:
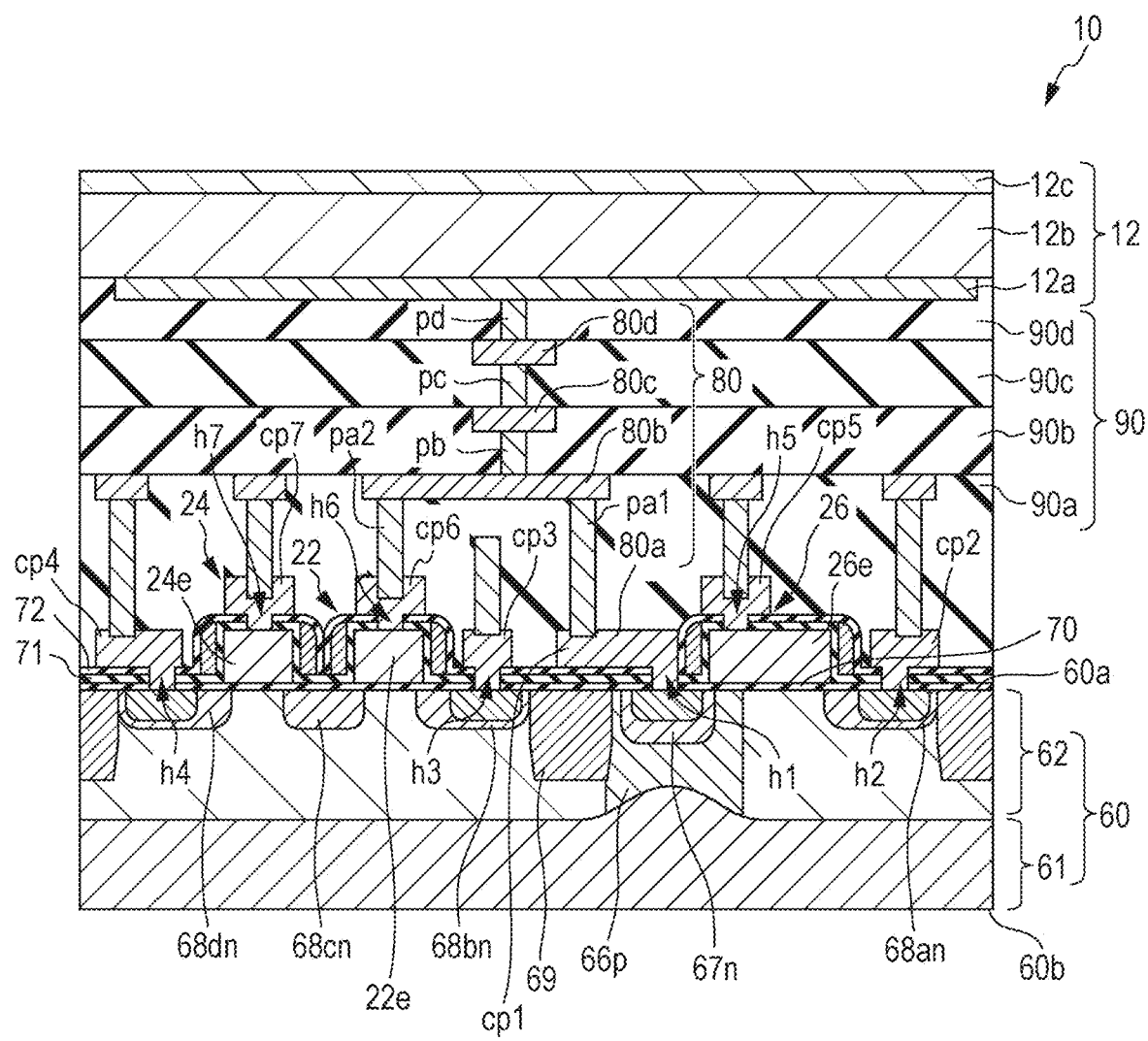
FIG. 3 is a schematic cross-sectional view taken along line III-III in FIG. 2.

FIG. 2 is a plan view showing a layout inside the pixel 10 according to the embodiment. FIG. 3 is a schematic cross-sectional view of a device structure of the pixel 10. FIG. 2 schematically shows the arrangement of elements (the amplification transistor 22, the address transistor 24, the reset transistor 26, and the like) formed on the semiconductor substrate 60 when the pixel 10 shown in FIG. 3 is viewed from a direction perpendicular to the semiconductor substrate 60. Here, the amplification transistor 22 and the address transistor 24 are arranged in a linear manner along a vertical direction of the sheet surface. Note that in FIG. 2, a layout of pieces of wiring is not shown but a relation of connection among the pieces of wiring is indicated by lines.

FIG. 3 is a schematic cross-sectional view of the device structure of the pixel 10 according to the embodiment. FIG. 3 is a cross-sectional view in a case where the pixel 10 is cut along line III-III in FIG. 2 and is developed in directions indicated by arrows.

Note that a first diffusion region 67n which is an n-type impurity region is a drain region of the reset transistor 26 and a charge storage region (FD) in FIGS. 2 and 3.

The imaging device 100 according to the present embodiment includes the semiconductor substrate 60 and a plurality of pixels 10. Each of the plurality of pixels 10 includes the photoelectric converter 12 that converts light into charges and a plurality of transistors (the amplification transistor 22, the address transistor 24, and the reset transistor 26 here) which are located in the semiconductor substrate 60 and include respective sources and drains containing an impurity of a first conductivity type (hereinafter referred to as n-type).

As schematically shown in FIG. 3, the pixel 10 schematically includes the semiconductor substrate 60, the photoelectric converter 12 that is arranged on the upper side of the semiconductor substrate 60, and a wiring structure 80. The wiring structure 80 is arranged inside an interlayer insulating layer 90 which is formed between the photoelectric converter 12 and the semiconductor substrate 60 and includes a structure which electrically connects the amplification transistor 22 formed on the semiconductor substrate 60 to the photoelectric converter 12. The interlayer insulating layer 90 here has a layered structure including four insulating layers, insulating layers 90a, 90b, 90c, and 90d (hereinafter 90a to 90d). The wiring structure 80 includes four wiring layers, wiring layers 80a, 80b, 80c, and 80d (hereinafter 80a to 80d), and plugs pa1, pa2, pb, pc, and pd which are arranged between the wiring layers. The wiring layer 80a includes contact plugs cp1, cp2, cp3, cp4, cp5, cp6, and cp7 (hereinafter cp1 to cp7). It is apparent that the number of insulating layers in the interlayer insulating layer 90 and the number of wiring layers in the wiring structure 80 are not limited to those in the present example and may be arbitrarily set.

The photoelectric converter 12 is arranged on the interlayer insulating layer 90. The photoelectric converter 12 includes a pixel electrode 12a which is formed on the interlayer insulating layer 90, a transparent electrode 12c which faces the pixel electrode 12a, and a photoelectric conversion layer 12b which is arranged between the electrodes. The photoelectric conversion layer 12b of the photoelectric converter 12 is made of an organic material such as quinacridone or an inorganic material such as amorphous silicon. The photoelectric conversion layer 12b receives light incident via the transparent electrode 12c and generates positive and negative charges through photoelectric conversion. The photoelectric conversion layer 12b is typically formed across the plurality of pixels 10. The photoelectric conversion layer 12b may include a layer which is made of an organic material and a layer which is made of an inorganic material.

The transparent electrode 12c is made of a transparent conductive material, such as ITO, and is arranged on a light-receiving surface side of the photoelectric conversion layer 12b. The transparent electrode 12c is typically formed across the plurality of pixels 10, like the photoelectric conversion layer 12b. Although not shown in FIG. 3, the transparent electrode 12c has a connection to the storage control line 39 described above. When the imaging device 100 is in operation, signal charges generated through photoelectric conversion can be collected by the pixel electrode 12a by controlling a potential of the storage control line 39 to make a potential of the transparent electrode 12c different from a potential of the pixel electrode 12a. For example, the potential of the storage control line 39 is controlled such that the potential of the transparent electrode 12c is higher than that of the pixel electrode 12a. More specifically, a positive voltage of, for example, about 10 V is applied to the storage control line 39. This allows the pixel electrode 12a to collect a hole of a hole-electron pair generated by the photoelectric conversion layer 12b. Signal charges collected by the pixel electrode 12a are stored in the first diffusion region 67n via the wiring structure 80.

The pixel electrode 12a is an electrode which is made of a polysilicon and the like given conductivity by being doped with a metal, such as aluminum or copper, a metal nitride, or an impurity. The pixel electrode 12a is electrically isolated from the pixel electrode 12a of the different adjacent pixel 10 by being spatially isolated from the pixel electrode 12a of the different pixel 10.

The semiconductor substrate 60 has a first surface 60a, on which light is incident, and a second surface 60b which faces the first surface 60a and includes a first region 61 which contains the impurity of n-type and a second region 62 which contains an impurity of a second conductivity type (hereinafter referred to as p-type) different from n-type and is located nearer to the first surface 60a than the first region 61.

In the second region 62, an n-type impurity region 68an which functions as the source or a drain of the reset transistor 26 is formed. Additionally, n-type impurity regions 68bn, 68cn, and 68dn which each function as the source or the drain of the amplification transistor 22 or the address transistor 24 are formed in the second region 62. In addition, the first diffusion region 67n that stores charges is formed in the second region 62. Note that a second diffusion region which is an n-type impurity region nearest to the first diffusion region 67n among the n-type impurity regions other than the first diffusion region 67n is the n-type impurity region denoted by reference character 68an in the present embodiment.

The reset transistor 26 includes the first diffusion region 67n and the second diffusion region 68an, a gate insulating film 70 which is formed on the semiconductor substrate 60, and a gate electrode 26e on the gate insulating film 70. The first diffusion region 67n and the second diffusion region 68an function as the drain and a source, respectively, of the reset transistor 26. The first diffusion region 67n functions as a charge storage region for temporarily storing signal charges generated by the photoelectric converter 12.

The second region 62 includes a p-type impurity region 66p which is lower in impurity concentration than the second region 62, the first diffusion region 67n formed inside the p-type impurity region 66p, the second diffusion region 68an, the n-type impurity regions 68bn to 68dn, and an element isolation region 69.

The amplification transistor 22 includes the n-type impurity regions 68bn and 68cn, a part of the gate insulating film 70, and a gate electrode 22e on the gate insulating film 70.

The n-type impurity regions 68bn and 68cn function as a drain and a source, respectively, of the amplification transistor 22.

The element isolation region 69 is arranged between the n-type impurity region 68bn and the first diffusion region 67n. The element isolation region 69 is, for example, a p-type impurity diffusion region. The element isolation region 69 electrically isolates the amplification transistor 22 from the reset transistor 26.

The element isolation region 69 is also arranged between adjacent pixels 10 to electrically isolate the signal detection circuits 14 of the pixels 10. The element isolation region 69 here is provided around the amplification transistor 22 and the address transistor 24 as a set and around the reset transistor 26.

The first diffusion region 67n is formed inside the p-type impurity region 66p lower in impurity concentration than the second region 62, which causes the first diffusion region 67n and the element isolation region 69 to be arranged so as not to be in contact with each other. For example, if a p-type impurity layer is used as the element isolation region 69, contact of the first diffusion region 67n with the element isolation region 69 makes both a p-type impurity concentration and an n-type impurity concentration at a junction higher. For this reason, a leakage current due to the high junction concentration is likely to be generated around the junction between the first diffusion region 67n and the element isolation region 69. In other words, since the first diffusion region 67n and the element isolation region 69 are arranged so as not to be in contact with each other, even if a high-concentration p-type impurity layer is used as the element isolation region 69, it is possible to curb a rise in pn junction concentration and reduce a leakage current. Even in a case using a shallow trench isolation (STI) structure as the element isolation region 69, the first diffusion region 67n and the STI structure are desirably arranged so as not to be in contact with each other in order to reduce a leakage current due to a crystal defect at an STI side wall portion.

The address transistor 24 includes the n-type impurity regions 68cn and 68dn, a part of the gate insulating film 70, and a gate electrode 24e on the gate insulating film 70. In the present example, the address transistor 24 is electrically connected to the amplification transistor 22 by sharing the n-type impurity region 68cn with the amplification transistor 22. The n-type impurity region 68cn functions as a drain of the address transistor 24 while the n-type impurity region 68dn functions as a source of the address transistor 24.

In the present example, an insulating layer 72 is provided so as to cover the gate electrode 26e of the reset transistor 26, the gate electrode 22e of the amplification transistor 22, and the gate electrode 24e of the address transistor 24. The insulating layer 72 is, for example, a silicon oxide film. In the example, an insulating layer 71 intervenes between the insulating layer 72 and each of the gate electrodes 26e, 22e, and 24e. The insulating layer 71 is, for example, a silicon oxide film. The insulating layer 71 may have a layered structure including a plurality of insulating layers. Similarly, the insulating layer 72 can also have a layered structure including a plurality of insulating layers.

A layered structure of the insulating layers 72 and 71 has a plurality of contact holes. Here, contact holes h1 to h7 are provided in the insulating layers 72 and 71. The contact holes h1 to h4 are formed at respective positions overlapping with the first diffusion region 67n, the second diffusion region 68an, and the different n-type impurity regions 68bn and 68dn. The contact plugs cp1 to cp4 are arranged at positions corresponding to the contact holes h1 to h4, respectively. The contact holes h5 to h7 are formed at respective positions overlapping with the gate electrodes 26e, 22e, and 24e. The contact plugs cp5 to cp7 are arranged at positions corresponding to the contact holes h5 to h7, respectively.

In the configuration illustrated in FIG. 3, the wiring layer 80a is a layer including the contact plugs cp1 to cp7 and is typically a polysilicon layer doped with an n-type impurity. Of wiring layers included in the wiring structure 80, the wiring layer 80a is arranged nearest to the semiconductor substrate 60. The wiring layer 80b and the plugs pa1 and pa2 are arranged inside the insulating layer 90a. The plug pa1 connects the contact plug cp1 to the wiring layer 80b while the plug pa2 connects the contact plug cp6 to the wiring layer 80b. That is, the first diffusion region 67n and the gate electrode 22e of the amplification transistor 22 are electrically connected to each other via the contact plugs cp1 and cp6, the plugs pa1 and pa2, and the wiring layer 80b.

The wiring layer 80b is arranged inside the insulating layer 90a and can include, as part, the vertical signal line 35, the address signal line 34, the piece 32 of power-supply wiring, the reset signal line 36, the feedback line 53, and the like described above. The vertical signal line 35, the address signal line 34, the piece 32 of power-supply wiring, the reset signal line 36, and the feedback line 53 are connected to the n-type impurity region 68dn, the gate electrode 24e, the n-type impurity region 68bn, the gate electrode 26e, and the second diffusion region 68an via the contact plugs cp4, cp7, cp3, cp5, and cp2, respectively.

The plug pb arranged inside the insulating layer 90b connects the wiring layer 80b to the wiring layer 80c. Similarly, the plug pc arranged inside the insulating layer 90c connects the wiring layer 80c to the wiring layer 80d. The plug pd arranged inside the insulating layer 90d connects the wiring layer 80d to the pixel electrode 12a of the photoelectric converter 12. The wiring layers 80b to 80d and the plugs pa1, pa2, and pb to pd are typically made of a metal, such as copper or tungsten, a metal compound, such as a metal nitride or a metal oxide, or the like.

The plugs pa1, pa2, and pb to pd, the wiring layers 80b to 80d, and the contact plugs cp1 and cp6 electrically connect the photoelectric converter 12 to the signal detection circuit 14 formed on the semiconductor substrate 60. The plugs pa1, pa2, and pb to pd, the wiring layers 80b to 80d, the contact plugs cp1 and cp6, the pixel electrode 12a of the photoelectric converter 12, the gate electrode 22e of the amplification transistor 22, and the first diffusion region 67n function as charge storage regions for storing a signal charge (a hole here) generated by the photoelectric converter 12.

Focus here on the n-type impurity regions formed in the semiconductor substrate 60. Of the n-type impurity regions formed in the semiconductor substrate 60, the first diffusion region 67n is arranged inside the p-type impurity region 66p that is formed inside the second region 62 as a p well. The first diffusion region 67n is formed near a surface of the semiconductor substrate 60, and at least a part thereof is located at the surface of the semiconductor substrate 60. A junction capacitance formed by a pn junction between the p-type impurity region 66p and the first diffusion region 67n functions as a capacitance which stores at least a part of signal charges and constitutes a part of a charge storage region.

In the imaging device 100 according to the present embodiment, a distance between the second diffusion region 68an and the first region 61 is equal to or less than 1.5 times a distance between the second diffusion region 68an and the first diffusion region 67n and is desirably equal to or less than 1.0 times. A distance here refers to a distance between portions nearest to each other of two regions.

With the above-described configuration, minority carriers generated at a junction between the second diffusion region 68an containing the n-type impurity and the second region 62 containing the p-type impurity of the semiconductor substrate 60 are more likely to be absorbed in the first region 61 containing the n-type impurity. A minority carrier here refers to a carrier with a polarity opposite to a polarity of a carrier which contributes mainly to electrical conduction of the semiconductor substrate 60. For example, minority carriers in a p-type semiconductor substrate are electrons. For this reason, inflow of minority carriers into the first diffusion region 67n that is a charge storage region can be reduced. That is, a leakage current to the first diffusion region 67n as a charge storage region can be reduced. It is thus possible to reduce a dark current in the first diffusion region 67n and variation in dark current.

Note that the present embodiment has illustrated an example in which the n-type impurity region 68an that is a source region of the reset transistor 26 including the first diffusion region 67n as the drain region is the second diffusion region. However, the second diffusion region may be a source region or a drain region nearest to the first diffusion region 67n among source regions and drain regions of different transistors (the amplification transistor 22 and the address transistor 24 here) other than the reset transistor 26 including the first diffusion region 67n. Alternatively, the second diffusion region may be a part of a different electrical element (a diode, for example) other than a transistor.

For example, minority carriers generated near the source region or the drain region nearest to the first diffusion region 67n among the source regions and the drain regions of the different transistors that do not include the first diffusion region 67n can also be absorbed in the first region 61 of the semiconductor substrate 60. This allows reduction of inflow of minority carriers into the first diffusion region 67n that is a charge storage region. That is, a leakage current to the first diffusion region 67n as a charge storage region can be reduced. It is thus possible to reduce a dark current in the first diffusion region 67n and variation in dark current.

The first region 61 of the semiconductor substrate 60 includes a first portion which faces the first diffusion region 67n and a second portion which does not face the first diffusion region 67n, and a distance between the first portion and the first surface 60a is smaller than a distance between the second portion and the first surface 60a. That is, in the present embodiment, the first portion facing the first diffusion region 67n in the first region 61 has a shape convex toward the first diffusion region 67n.

For this reason, minority carriers in the semiconductor substrate 60 (in the second region 62 here) are absorbed into the first portion of the first region 61 before the minority carriers arrive at the first diffusion region 67n that is a charge storage region. Inflow of minority carriers into the first diffusion region 67n as a charge storage region can be reduced. It is thus possible to reduce a dark current in the first diffusion region 67n and variation in dark current.

Note that the reason why the first portion of the first region 61 has a convex shape will be described in a part associated with a manufacturing method and is not described here.

Figure 4A:
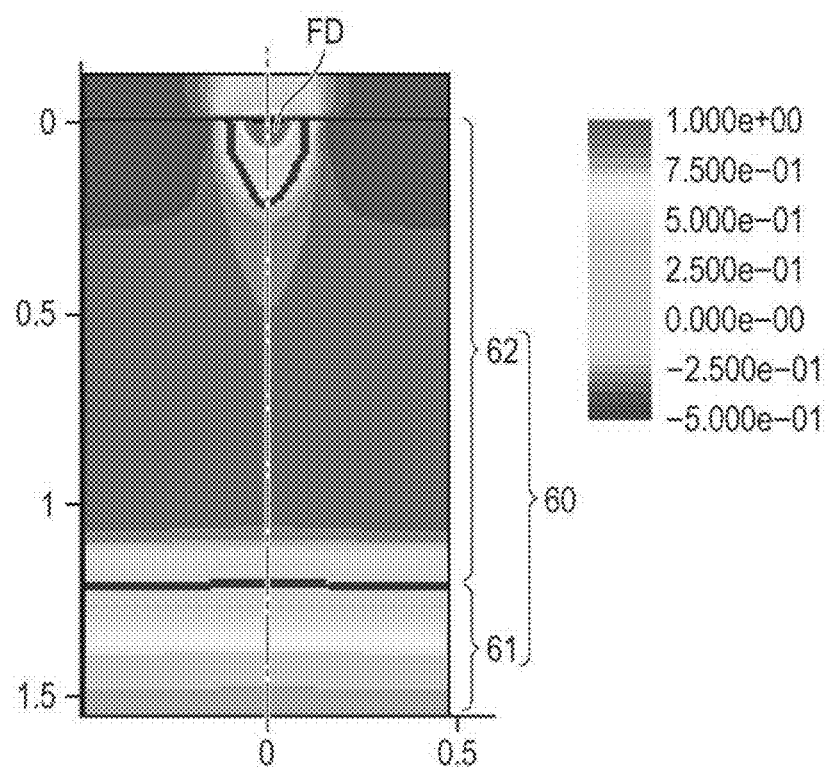
FIG. 4A is a chart showing a potential distribution in and around a first diffusion region of a semiconductor substrate according to a reference example.
Figure 4B:
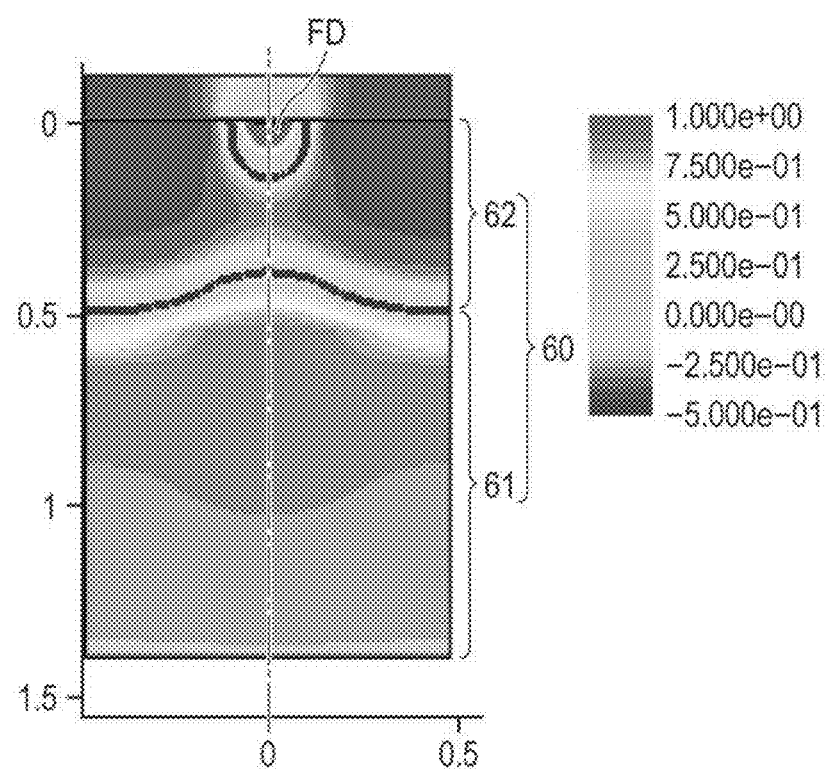
FIG. 4B is a chart showing a potential distribution in and around a first diffusion region of a semiconductor substrate according to the embodiment.

A difference in a potential distribution in and around a first diffusion region between a semiconductor substrate according to a reference example and the semiconductor substrate 60 according to the embodiment will be described with reference to FIGS. 4A, 4B, and 5. FIGS. 4A and 4B are schematic cross-sectional views of a portion in and around a first diffusion region of the semiconductor substrate according to the reference example and a portion in and around a first diffusion region of the semiconductor substrate 60 according to the embodiment. FIG. 4A shows a potential distribution in the semiconductor substrate according to the reference example, and FIG. 4B shows a potential distribution in the semiconductor substrate 60 according to the embodiment. Note that the second region 62 is a p-type semiconductor layer uniform in impurity concentration in each of the cross-sectional views shown in FIGS. 4A and 4B.

As shown in FIG. 4A, a distance between a first region which is an n-type semiconductor layer and the first diffusion region in the semiconductor substrate according to the reference example is larger than a distance between the first diffusion region 67n and the first region 61 in the semiconductor substrate 60 according to the present embodiment. For this reason, in the semiconductor substrate according to the reference example, the potential distribution in a depth direction of the semiconductor substrate from the first diffusion region has a continuous portion where a p-type impurity has a uniform potential. As shown in FIG. 4B, in the semiconductor substrate 60 according to the present embodiment, the potential distribution in a depth direction of the semiconductor substrate 60 from the first diffusion region 67n has no continuous portion where a p-type impurity has a uniform potential because a distance between the first diffusion region 67n and the first portion of the first region 61 is small.

FIG. 5 is a graph (hereinafter referred to as potential curves) showing potential distributions in the depth directions of the semiconductor substrates 60 along line segments passing through centers of the first diffusion regions shown in FIGS. 4A and 4B. That is, FIG. 5 shows a potential distribution inside the semiconductor substrate 60 in a direction from the first surface 60a toward the second surface 60b along a line segment passing through the center of the first diffusion region 67n.

The potential curves shown in FIG. 5 each have a first range within which a potential decreases monotonously, a second range within which the potential increases monotonously, and a third range between the first range and the second range. The potential curve for the imaging device 100 according to the present embodiment has the first range, within which the potential decreases monotonously, the second range, within which the potential increases monotonously, and the third range that is located between the first range and the second range and is smaller in an absolute value of a slope than the first range and the second range. A width of the third range may be smaller than a sum of a width of the first range and a width of the second range.

The smaller the width of the third range becomes compared to the sum of the width of the first range and the width of the second range, the smaller the distance between the first diffusion region 67n and the first region 61 becomes. Accordingly, minority carriers in the semiconductor substrate 60 are more likely to be absorbed in the first region 61. It is thus possible to reduce inflow of minority carriers into the first diffusion region 67n.

The potential distribution in the conventional semiconductor substrate will be compared with the potential distribution in the semiconductor substrate 60 according to the present embodiment with reference to FIG. 5. In the conventional semiconductor substrate, the distance between the first region containing an n-type impurity and the first diffusion region is large. For this reason, a width W3a of the third range that indicates a potential of a p-type impurity contained in a second region is large. The width W3a of the third range is larger than any one of a width W1a of the first range and a width W2a of the second range.

In the semiconductor substrate 60 according to the present embodiment, the distance between the first region 61 and the first diffusion region 67n containing the n-type impurity is small, as described with reference to FIG. 4B. For this reason, a width W3b of the third range that indicates a potential of the p-type impurity contained in the second region 62 is small, as compared to the conventional semiconductor substrate. The width W3b of the third range of the potential curve is smaller than a sum of a width W1b of the first range and a width W2b of the second range. More specifically, as shown in FIG. 5, the potential curve is V-shaped in the potential distribution according to the present embodiment. That is, the more steeply V-shape the potential curve has, the smaller the distance between the first diffusion region 67n and the first region 61 becomes.

Figure 6:
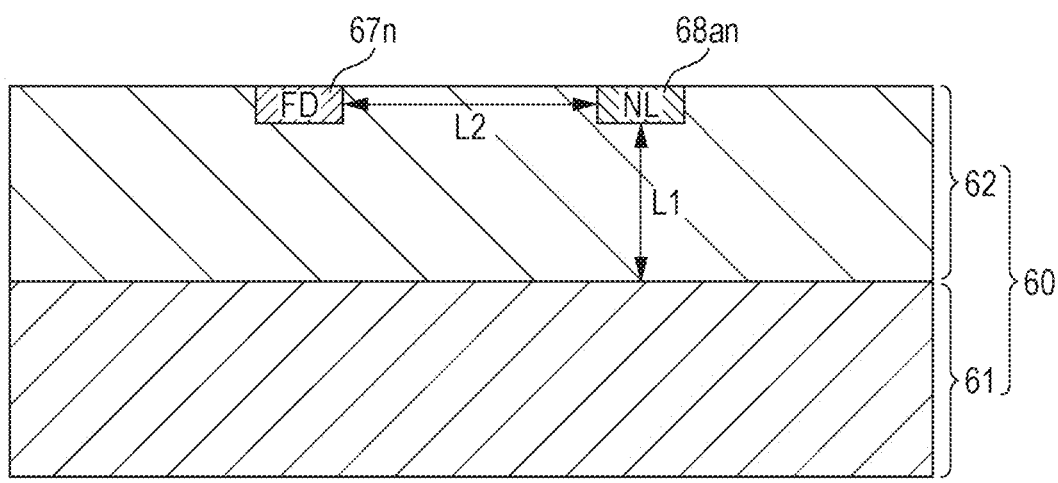
FIG. 6 is a view showing a condition for the semiconductor substrate used in a simulation which measures a leakage current.

Influence of a ratio between a distance L1 between the second diffusion region 68an and the first region 61 and a distance L2 between the second diffusion region 68an and the first diffusion region 67n on a dark current reduction effect will be described with reference to FIGS. 6 to 8. FIG. 6 is a view showing a condition for the semiconductor substrate 60 used in a simulation which measures a leakage current. More specifically, the simulation was performed with the configuration below. The first diffusion region 67n and the second diffusion region 68an are arranged in the semiconductor substrate 60. The second region 62 of the semiconductor substrate 60 is a p-type semiconductor layer and contains boron as a p-type impurity. The first region 61 of the semiconductor substrate 60 is an n-type semiconductor layer and contains phosphorus as an n-type impurity. The second region 62 has a uniform p-type impurity concentration here.

As described above, the second diffusion region 68an is an n-type impurity region nearest to the first diffusion region 67n among the source regions and the drain regions of the plurality of transistors inside the pixel 10.

In the semiconductor substrate 60 shown in FIG. 6, a predetermined voltage was applied between the second diffusion region 68an and the semiconductor substrate 60. At the time, the distance L1 between the second diffusion region 68an and the first region 61 was varied while the distance L2 between the second diffusion region 68an and the first diffusion region 67n was fixed to 0.57 µm.

Figure 7:
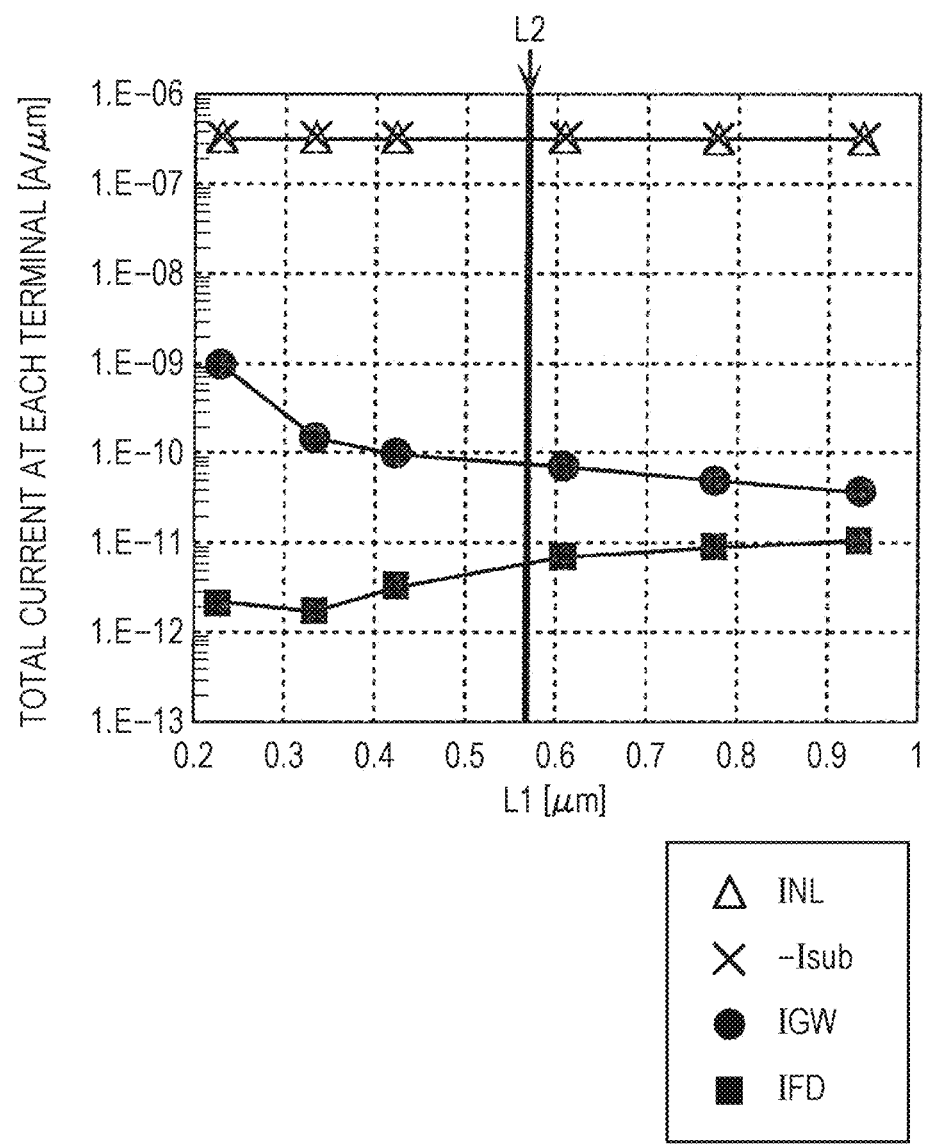
FIG. 7 is a graph showing currents flowing to terminals when a predetermined voltage is applied between a second diffusion region and the semiconductor substrate shown in FIG. 6.
Figure 8:
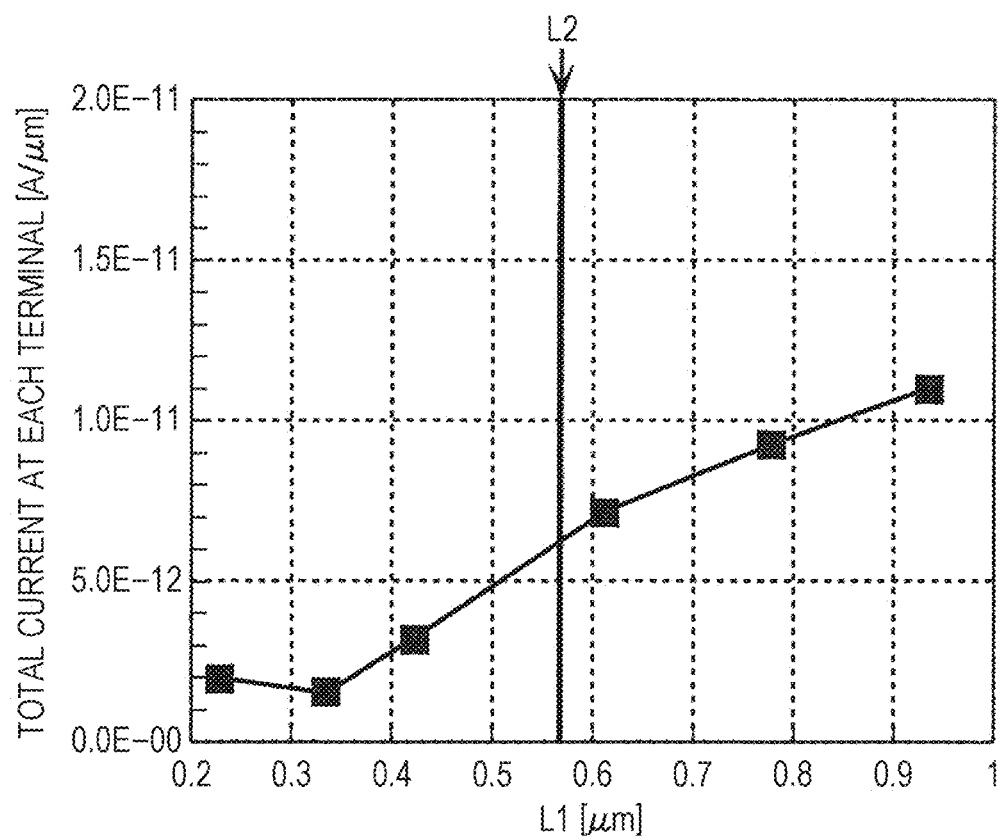
FIG. 8 is an enlargement of a curve of a current flowing to the first diffusion region in FIG. 7.

FIG. 7 is a graph showing currents flowing to terminals when the voltage is applied between the second diffusion region 68an and the semiconductor substrate 60. FIG. 8 is an enlargement of a curve of a current flowing to the first diffusion region in FIG. 7. A current INL here is a current which flows to the second diffusion region 68an. A current −Isub is a current which flows to the second region 62 of the semiconductor substrate 60. A current IGW is a current which flows to the first region 61 of the semiconductor substrate 60. A current IFD is a current which flows to the first diffusion region 67n.

As shown in FIG. 7, the current INL and the current −Isub are almost equal in magnitude. That is, if a predetermined current is fed to the semiconductor substrate 60 through the second diffusion region 68an, most of the current fed to the second diffusion region 68an flows to the second region 62 of the semiconductor substrate 60. The current IGW is larger than the current IFD. That is, a current which flows to the first region 61 of the semiconductor substrate 60 is larger than a current which flows to the first diffusion region 67n. As can be seen from this, when a current is fed to the semiconductor substrate 60 through the second diffusion region 68an, most of the current flows to the second region 62, a part of the current flows to the first region 61, and a part of the current flows to the first diffusion region 67n.

Additionally, as the distance L1 between the second diffusion region 68an and the first region 61 becomes smaller, the current IGW becomes larger, and the current IFD becomes smaller. That is, as the distance between the second diffusion region 68an and the first region 61 becomes smaller, a current which flows to the first region 61 becomes larger, and a current which flows to the first diffusion region 67n becomes smaller.

More specifically, the current IFD starts to decrease when the distance L1 between the second diffusion region 68an and the first region 61 is about 0.94 µm (L1/L2=1.65). The current IFD decreases with a decrease in the distance L1 to about 0.78 µm (L1/L2=1.37), then to about 0.61 µm (L1/L2=1.07), then to about 0.42 µm (L1/L2=0.74), then to about 0.33 µm (L1/L2=0.58), and then to about 0.23 µm (L1/L2=0.40).

Thus, in the present embodiment, the distance L1 between the second diffusion region 68an and the first region 61 is equal to or less than 1.5 times the distance L2 between the second diffusion region 68an and the first diffusion region 67n. The distance L1 may be equal to or less than the distance L2. Alternatively, the distance L1 may be equal to or less than 0.7 times the distance L2 or equal to or less than 0.6 times.

With the above-described configuration, minority carriers (electrons here) generated at the junction between the second diffusion region 68an containing the n-type impurity and the second region 62 containing the p-type impurity of the semiconductor substrate 60 are more likely to be absorbed in the first region 61 containing the n-type impurity. For this reason, inflow of minority carriers into the first diffusion region 67n that is a charge storage region can be reduced. That is, a leakage current to the first diffusion region 67n as a charge storage region can be reduced. It is thus possible to reduce a dark current in the first diffusion region 67n and variation in dark current.

FIGS. 9A to 9E are views for explaining a manufacturing method for the semiconductor substrate 60 according to the present embodiment.

Figure 9A:
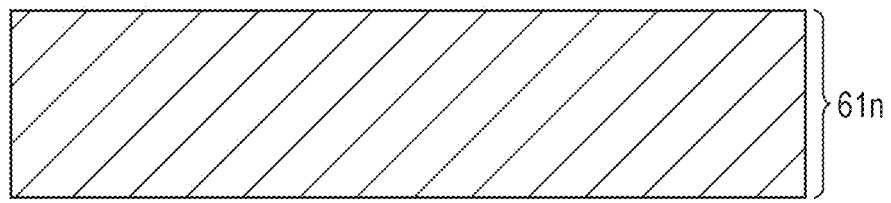
FIG. 9A is a view for explaining a manufacturing method for the semiconductor substrate according to the embodiment.

As shown in FIG. 9A, an n-type semiconductor substrate 61n is prepared first.

Figure 9B:
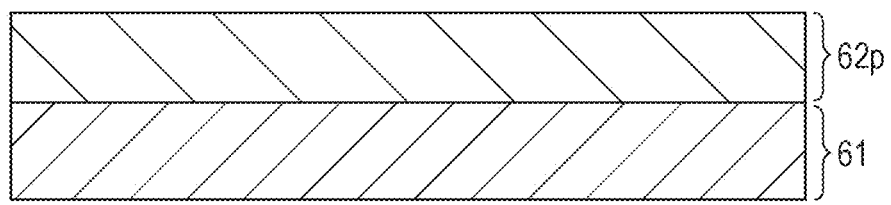
FIG. 9B is a view for explaining the manufacturing method for the semiconductor substrate according to the embodiment.

As shown in FIG. 9B, a p-type impurity is implanted into the n-type semiconductor substrate 61n to fabricate a p-type impurity layer 62p. A p-type impurity concentration in the p-type impurity layer 62p at this time is lower than a p-type impurity concentration in the second region 62 in FIG. 9E. An n-type semiconductor layer which is located on a lower side of the p-type impurity layer 62p is the first region 61.

Figure 9C:
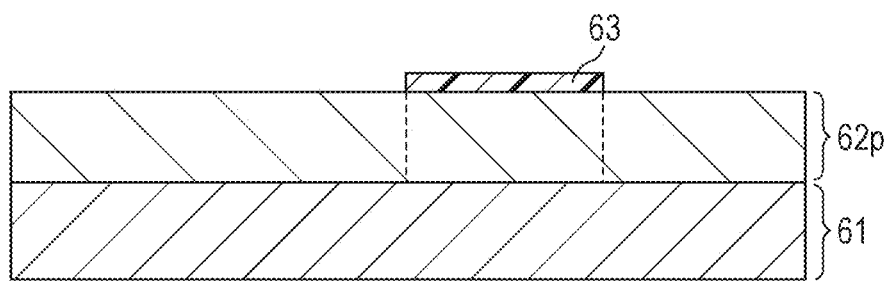
FIG. 9C is a view for explaining the manufacturing method for the semiconductor substrate according to the embodiment.
Figure 9D:
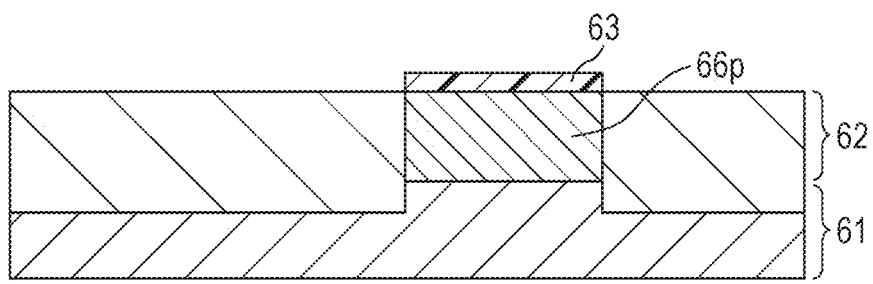
FIG. 9D is a view for explaining the manufacturing method for the semiconductor substrate according to the embodiment.
Figure 9E:
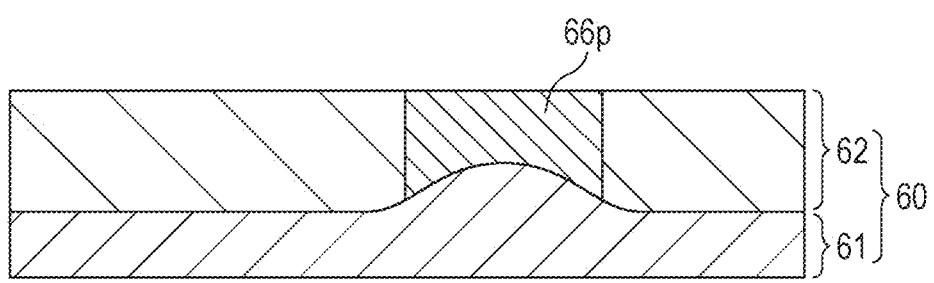
FIG. 9E is a view for explaining the manufacturing method for the semiconductor substrate according to the embodiment.

As shown in FIG. 9C, a portion at which the p-type impurity region 66p is to be formed is covered with a resist 63, and the p-type impurity is further implanted into the p-type impurity layer 62p. As shown in FIG. 9D, at a portion which is not covered with the resist 63, the implantation of the p-type impurity causes an interface between the first region 61 and the p-type impurity layer 62p to recede downward. After the implantation of the p-type impurity, the resist 63 is removed. After that, heat treatment is performed to obtain the semiconductor substrate 60 as shown in FIG. 9E.

During a process of forming the p-type impurity region 66p lower in p-type impurity concentration than the second region 62 in the second region 62, unevenness shows up at an interface between the first region 61 and the second region 62. That is, as shown in FIG. 9D, an interface between the p-type impurity region 66p and the first region 61 is formed to have a convex shape. Note that the first diffusion region 67n is formed inside the p-type impurity region 66p.

With the above-described configuration, in the present embodiment, the distance between the first portion that faces the first diffusion region 67n of the first region 61 and the first surface 60a (see FIG. 3) of the semiconductor substrate 60 is smaller than the distance between the second portion that does not face the first diffusion region 67n of the first region 61 and the first surface 60a of the semiconductor substrate 60.

The semiconductor substrate 60 is formed in the above-described manner. Transistors, wiring, and a photoelectric converter are then formed using general lithography to manufacture the imaging device 100 according to the present embodiment.

Note that, in the present embodiment, the p-type impurity region 66p lower in p-type impurity concentration than the second region 62 is formed in the second region 62 that is a p-type semiconductor layer. The second region 62, however, may be a semiconductor layer uniform in p-type impurity concentration. In this case, the first portion that faces the first diffusion region 67n of the first region 61 that is an n-type semiconductor layer may be formed to have a convex shape.

An imaging device according to the present disclosure has been described above on the basis of the embodiment. The present disclosure, however, is not limited to the embodiment. Forms obtained by making various modifications, which occur to those skilled in the art, to the embodiment and different forms obtained by combining some constituent elements in the embodiment are also included in the scope of the present disclosure as long as the forms do not depart from the gist of the present disclosure.

Note that although the imaging device 100 according to the present embodiment includes the amplification transistor 22, the address transistor 24, and the reset transistor 26 inside the pixel 10, the imaging device 100 may further include an anti-seizure transistor. This allows transistors to be prevented from failing due to an overvoltage even if excessive light is incident on the photoelectric converter 12.

Each of the transistors described above may be a P-channel MOS. If each transistor is a P-channel MOS, an impurity of a first conductivity type is a p-type impurity, and an impurity of a second conductivity type is an n-type impurity. The transistors need not be all N-channel MOSs or P-channel MOSs. If N-channel MOSs are used as transistors inside a pixel, and an electron is used as a signal charge, voltages to be applied to a photoelectric converter and the transistors may be appropriately changed.

The first diffusion region 67n according to the present embodiment may include a high-concentration n-type impurity region at a portion in contact with a contact plug. This allows a reduction in resistance of a connection between the first diffusion region 67n and the contact plug.

In the present embodiment, the distance between the first portion of the first region 61, which faces the first diffusion region 67n, and the first surface 60a of the semiconductor substrate 60 is set to be smaller than the distance between the second portion of the first region 61, which does not face the first diffusion region 67n, and the first surface 60a of the semiconductor substrate 60. Similarly, a distance between a portion of the first region 61, which faces the second diffusion region 68an, and the first surface 60a may be set to be smaller than a distance between a portion of the first region 61, which does not face the second diffusion region 68an, and the first surface 60a. When the n-type impurity region 68bn is nearer to the first diffusion region 67n than the second diffusion region 68an is, a distance between a portion of the first region 61, which faces the n-type impurity region 68bn, and the first surface 60a may be set to be smaller than a distance between a portion of the first region 61, which does not face the n-type impurity region 68bn, and the first surface 60a. As described above, inflow of minority carriers inside each pixel into the first diffusion region 67n can be reduced by applying the above-described configuration to an impurity region nearest to the first diffusion region 67n. Additionally, the above-described configuration may not be applied to the first diffusion region 67n, and may be applied to another impurity region (e. g., the second diffusion region 68an or the n-type impurity region 68bn) other than the first diffusion region 67n. In this case, even if a vicinity of a portion which faces the first diffusion region 67n of the first region 61 is flat, minority carriers inside the pixel are likely to flow into a portion which faces a different impurity region other than the first diffusion region 67n of the first region 61. This allows reduction of inflow of minority carriers into the first diffusion region 67n.

An imaging device according to the present disclosure has been illustrated above taking an imaging device including a photoelectric converter having a photoelectric conversion film as an example. An imaging device according to the present disclosure may be an imaging device including a photodiode as a photoelectric converter. An example in which a plurality of transistors are N-channel MOS transistors, as in the embodiment, will be illustrated. A first conductivity type is n-type, and a second conductivity type is p-type. Note that the plurality of transistors may be P-channel MOS transistors. In this case, the first conductivity type is p-type, and the second conductivity type is n-type.

Figure 10:
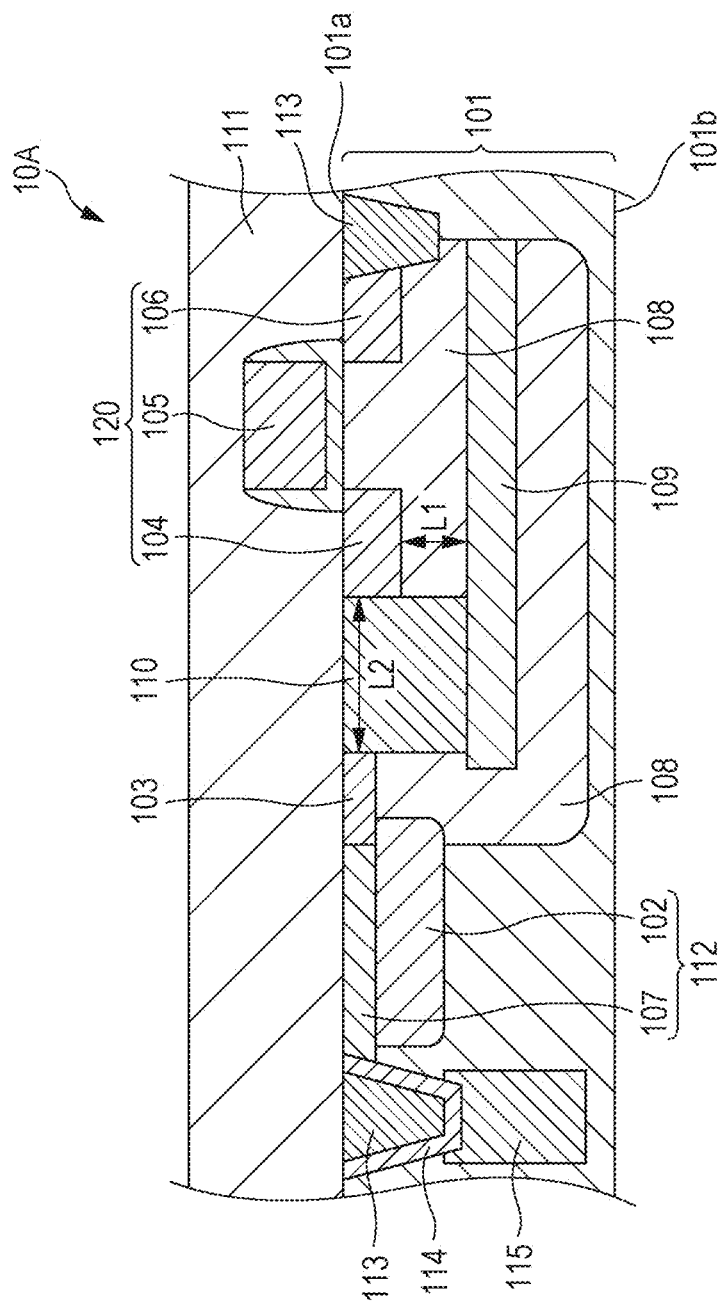
FIG. 10 is a view for explaining a configuration of a pixel in a photodiode (PD) imaging device.

FIG. 10 is a view for explaining a configuration of a pixel 10A in an imaging device including a photodiode as a photoelectric converter. For example, the imaging device including a photodiode includes a semiconductor substrate 101 and a plurality of pixels 10A.

As shown in FIG. 10, the plurality of pixels 10A each include a photodiode 112 and a plurality of transistors which are located in the semiconductor substrate 101 and each include a source and a drain containing an n-type impurity. The photodiode 112 is a photoelectric converter which converts light into charges. The photodiode 112 includes an n-type impurity layer 102 which contains the n-type impurity and a pinning region 107 which is in contact with the n-type impurity layer 102 and contains a p-type impurity. A transistor 120 which is one of the plurality of transistors includes an n-type impurity region 104, an n-type impurity region 106, and a gate electrode 105.

The pixel 10A includes an isolation region 110 which isolates the plurality of transistors from each other. An element isolation region 113 which electrically isolates adjacent pixels 10A from each other is also arranged. The pixel 10A also includes a PD isolation region 115 which electrically isolates the photodiode 112 from a photodiode (not shown) inside the pixel 10A adjacent to the pixel 10A. The PD isolation region 115 contains a high concentration of the p-type impurity. The isolation region 110 is a region which electrically isolates the photodiode 112 and a first diffusion region 103 which are adjacent to each other from the transistor 120 and contains a high concentration of the p-type impurity. The element isolation region 113 may be arranged not only so as to electrically isolate the adjacent pixels 10A from each other but also so as to, for example, electrically isolate adjacent elements arranged inside each pixel 10A from each other. The element isolation region 113 is formed using an oxide, such as silicon dioxide. The element isolation region 113 may be further coated with a high-concentration p-type impurity layer 114. This configuration allows a reduction in a dark current which is generated at an interface between the element isolation region 113 and the substrate or an element adjacent thereto. Especially if the element isolation region 113 that isolates photodiodes of adjacent pixels from each other is coated with the p-type impurity layer 114, depletion layers around the photodiodes can be prevented from arriving at the element isolation region 113. Note that a p-type impurity concentration in the p-type impurity layer 114 may be higher than a p-type impurity concentration in the PD isolation region 115.

In the imaging device including a photodiode illustrated in FIG. 10, the semiconductor substrate 101 has a first surface 101a on which light is incident and a second surface 101b which faces the first surface 101a. The semiconductor substrate 101 further includes a first region 109 which contains the n-type impurity and a second region 108 which contains the impurity of p-type different from n-type and is located nearer to the first surface 101a than the first region 109. The sources and the drains of the plurality of transistors are located inside the second region 108. One of the sources and the drains of the plurality of transistors is the first diffusion region 103 that stores charges. The first diffusion region 103 is one of a source and a drain of a reset transistor (not shown). A distance L1 between the first region 109 and the second diffusion region 104 that is a source or a drain nearest to the first diffusion region 103 among the sources and the drains of the plurality of transistors is equal to or less than 1.5 times a distance L2 between the second diffusion region 104 and the first diffusion region 103. The distance L1 may be equal to or less than the distance L2. A distance here refers to a distance between portions nearest to each other of two regions.

With the above-described configuration, minority carriers which are generated at, for example, a junction between the second diffusion region 104 containing the n-type impurity and the second region 108 containing the p-type impurity are more likely to be absorbed in the first region 109. For this reason, inflow of minority carriers into the first diffusion region 103 that is a charge storage region can be reduced. That is, a leakage current to the first diffusion region 103 can be reduced. It is thus possible to reduce a dark current in the first diffusion region 103 and variation in dark current.

The second diffusion region 104 may be a source or a drain of the transistor 120 among a plurality of transistors other than the reset transistor (not shown) including the first diffusion region 103.

With the above-described configuration, unnecessary carriers which are generated in a region near a source region or a drain region nearest to the first diffusion region 103 among source regions and drain regions of different transistors which do not include the first diffusion region 103 can also be absorbed in the first region 109 of the semiconductor substrate 101. This allows reduction of inflow of unnecessary carriers into the first diffusion region 103 that is a charge storage region. That is, a leakage current to the first diffusion region 103 as a charge storage region can be reduced. It is thus possible to reduce a dark current in the first diffusion region 103 and variation in dark current.

Figure 11:
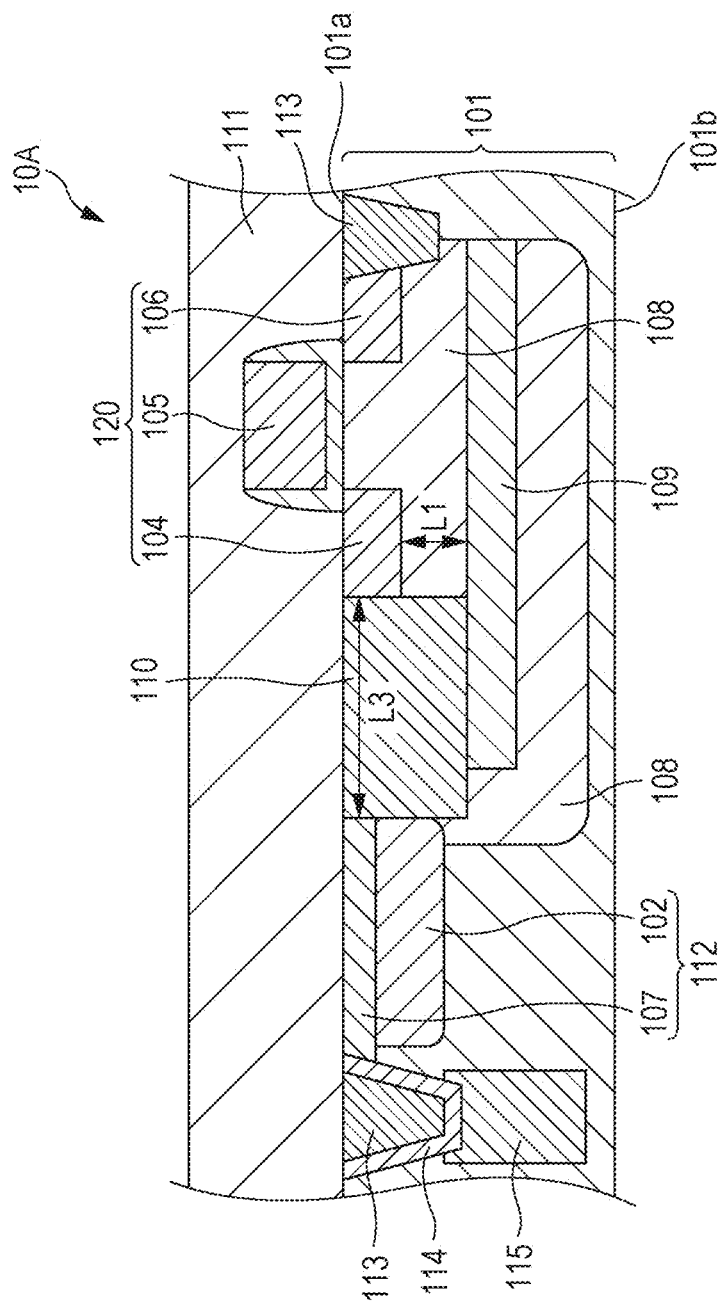
FIG. 11 is a schematic cross-sectional view of the pixel in the PD imaging device taken along a cross-section different from that in FIG. 10.

FIG. 11 is a schematic cross-sectional view of the pixel 10A taken along a cross-section different from that in FIG. 10. As described above, the pixel 10A includes the first diffusion region 103. Although not shown in FIG. 11, the first diffusion region 103 is electrically connected to the photodiode 112 inside the semiconductor substrate 101.

The photodiode 112 includes the n-type impurity layer 102 that contains the n-type impurity. As shown in FIG. 11, a distance L3 between the second diffusion region 104 and the n-type impurity layer 102 may be smaller than the distance L2 between the second diffusion region 104 and the first diffusion region 103 depending on a positional relation between the photodiode 112 and the first diffusion region 103. In this case, the distance L1 between the second diffusion region 104 and the first region 109 may be equal to or less than 1.5 times the distance L3 between the second diffusion region 104 and the n-type impurity layer 102 or equal to or less than the distance L3.

With the above-described configuration, minority carriers which are generated at, for example, the junction between the second diffusion region 104 containing the n-type impurity and the second region 108 containing the p-type impurity are more likely to be absorbed in the first region 109. For this reason, for example, inflow of minority carriers from the junction into the n-type impurity layer 102 of the photodiode 112 can be reduced. That is, a leakage current from the junction to the photodiode 112 can be reduced. It is thus possible to reduce a dark current in the photodiode 112 and variation in dark current.

FIG. 12 is a schematic cross-sectional view of the pixel 10A taken along a cross-section different from those in FIGS. 10 and 11. Although not shown in FIG. 12, the first diffusion region 103 is electrically connected to the photodiode 112 inside the semiconductor substrate 101.

As illustrated in FIG. 12, a transistor 121 includes the first diffusion region 103 that is an n-type impurity region, an n-type impurity region 117, and a gate electrode 116.

The first region 109 of the semiconductor substrate 101 includes a first portion which faces the first diffusion region 103 and a second portion which does not face the first diffusion region 103, and a distance between the first portion and the first surface 101a is smaller than a distance between the second portion and the first surface 101a. That is, in the first region 109, the first portion that faces the first diffusion region 103 has a shape convex toward the first diffusion region 103.

For this reason, unnecessary carriers inside the semiconductor substrate 101 (inside the second region 108 here) are absorbed in the first portion of the first region 109 before the unnecessary carriers arrive at the first diffusion region 103 that is a charge storage region. This allows reduction of inflow of unnecessary carriers into the first diffusion region 103 as a charge storage region. It is thus possible to reduce a dark current in the first diffusion region 103 and variation in dark current.

According to the present disclosure, an imaging device capable of reducing effects of a dark current and performing image pickup with high image quality is provided. The imaging device according to the present disclosure is useful as, for example, an image sensor or a digital camera. The imaging device according to the present disclosure can be used in a medical camera, a robot camera, a security camera, a camera used mounted on a vehicle, and the like.

What is claimed is:
1. An imaging device comprising:
   a semiconductor substrate having a first surface, the semiconductor substrate including:
   a first layer containing an impurity of a first conductivity type;
   a second layer containing an impurity of a second conductivity type different from the first conductiv- ity type, the second layer being closer to the first surface than the first layer is; and a pixel including:
  a photoelectric converter configured to convert light into charge; and
  a first diffusion region containing an impurity of the first conductivity type, the first diffusion region facing the first layer via the second layer, configured to store at least a part of the charge, wherein
the first layer has a second surface adjacent to the second layer, the second surface including a convex portion toward the first surface, the convex portion facing the first diffusion region.

2. The imaging device according to claim 1, wherein the pixel includes a first transistor, the first diffusion region functioning as a source or a drain of the first transistor.

3. The imaging device according to claim 1, wherein the photoelectric converter is located above the first surface of the semiconductor substrate.

4. The imaging device according to claim 1, wherein the photoelectric converter is located in the semiconductor substrate.

5. The imaging device according to claim 1, wherein the convex portion overlaps with the first diffusion region in a plan view.

6. The imaging device according to claim 1, wherein the first layer is in contact with the second layer.

7. The imaging device according to claim 6, wherein the first diffusion region is in contact with the second layer.

8. The imaging device according to claim 1, wherein
  the second surface includes a flat portion not facing the first diffusion region,
  the second layer includes a first portion adjacent to the convex portion and a second portion adjacent to the flat portion, and
  an impurity concentration in the first portion is less than an impurity concentration in the second portion.

9. An imaging device comprising:
  a semiconductor substrate having a first surface, the semiconductor substrate including:
    a first layer containing an impurity of a first conductivity type;
    a second layer containing an impurity of a second conductivity type different from the first conductivity type, the second layer being closer to the first surface, at least a part of the second layer being a part of the first surface; and
  a pixel including:
    a photoelectric converter configured to convert light into charge; and
    a first diffusion region containing an impurity of the first conductivity type, the first diffusion region facing the first layer via the second layer, configured to store at least a part of the charge, wherein
  the first layer includes a first portion adjacent to the second layer and a second portion adjacent to the second layer, the first portion facing the first diffusion region, the second portion not facing the first diffusion region, and
  a distance between the first portion and the first surface is less than a distance between the second portion and the first surface.

10. The imaging device according to claim 9, wherein the pixel includes a first transistor, the first diffusion region functioning as a source or a drain of the first transistor.

11. The imaging device according to claim 9, wherein the photoelectric converter is located above the first surface of the semiconductor substrate.

12. The imaging device according to claim 9, wherein the photoelectric converter is located in the semiconductor substrate.

13. The imaging device according to claim 9, wherein
  the first portion overlaps with the first diffusion region in a plan view, and
  the second portion does not overlap with the first diffusion region in the plan view.

14. The imaging device according to claim 9, wherein the first layer is in contact with the second layer.

15. The imaging device according to claim 14, wherein the first diffusion region is in contact with the second layer.

16. The imaging device according to claim 9, wherein
  the second layer includes a third portion adjacent to the first portion of the first layer and a fourth portion adjacent to the second portion of the first layer, and
  an impurity concentration in the third portion is less than an impurity concentration in the fourth portion.

17. The imaging device according to claim 9, further comprising an insulating layer disposed on the first surface of the semiconductor substrate, wherein
  the at least the part of the second layer is in direct contact with the insulating layer.

18. The imaging device according to claim 9, wherein a thickness of the first layer at a portion facing the first diffusion region is greater than a thickness of the first layer at any portion not facing the first diffusion region.

* * * * *